United States Patent
Curatola et al.

(10) Patent No.: US 8,963,219 B2
(45) Date of Patent: Feb. 24, 2015

(54) TUNNEL FIELD EFFECT TRANSISTOR

(75) Inventors: Gilberto Curatola, Korbek-lo (BE);
Dusan Golubovic, Leuven (BE);
Johannes Josephus Theodorus Marinus Donkers, Valkenswaard (NL);
Guillaume Boccardi, Woluwe-Saint-Lambert (BE); Hans Mertens, Leuven (BE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 13/270,898

(22) Filed: Oct. 11, 2011

(65) Prior Publication Data
US 2012/0086058 A1 Apr. 12, 2012

(30) Foreign Application Priority Data
Oct. 11, 2010 (EP) .................................. 10187157

(51) Int. Cl.
| | |
|---|---|
| *H01L 29/66* | (2006.01) |
| *H01L 29/76* | (2006.01) |
| *H01L 21/337* | (2006.01) |
| *H01L 29/739* | (2006.01) |
| *B82Y 10/00* | (2011.01) |
| *H01L 29/10* | (2006.01) |
| *H01L 29/165* | (2006.01) |

(52) U.S. Cl.
CPC ...... *H01L 29/7391* (2013.01); *H01L 29/66356* (2013.01); *B82Y 10/00* (2013.01); *H01L 29/1033* (2013.01); *H01L 29/165* (2013.01); *H01L 29/7613* (2013.01)
USPC ............ 257/288; 257/105; 257/192; 438/187

(58) Field of Classification Search
CPC ................... H01L 29/7391; H01L 29/66356; H01L 29/165
USPC ............... 257/27, 105, 192, 288, E21.403, 257/E21.404, E29.04, E29.042; 438/197
See application file for complete search history.

(56) References Cited

U.S. PATENT DOCUMENTS

| | | | |
|---|---|---|---|
| 2006/0244077 A1 | 11/2006 | Nowak | |
| 2007/0178650 A1* | 8/2007 | Chen et al. ................... | 438/301 |
| 2007/0267619 A1* | 11/2007 | Nirschl ............................ | 257/3 |
| 2009/0020818 A1 | 1/2009 | Voldman | |
| 2010/0032763 A1 | 2/2010 | Pillarisetty et al. | |
| 2010/0200916 A1* | 8/2010 | Gossner et al. ................ | 257/335 |
| 2011/0215425 A1* | 9/2011 | Loh et al. ....................... | 257/410 |
| 2011/0241103 A1 | 10/2011 | Curatola et al. | |
| 2011/0303950 A1* | 12/2011 | Lauer et al. .................. | 257/192 |
| 2012/0043607 A1* | 2/2012 | Luisier et al. ................. | 257/335 |

OTHER PUBLICATIONS

Uemura, T. et al. "Improved Negative Differential Resistance Characteristics in Surface Tunnel Transistors", Japanese Journal of Applied Physics, vol. 33, No. 10A, Part 02, pp. L1363-L1366 (Oct. 1, 1994).

(Continued)

*Primary Examiner* — Fernando L Toledo
*Assistant Examiner* — Aaron Gray

(57) ABSTRACT

A tunnel field effect transistor and a method of making the same. The transistor includes a semiconductor substrate. The transistor also includes a gate located on a major surface of the substrate. The transistor further includes a drain of a first conductivity type. The transistor also includes a source of a second conductivity type extending beneath the gate. The source is separated from the gate by a channel region and a gate dielectric. The transistor is operable to allow charge carrier tunnelling from an inversion layer through an upper surface of the source.

21 Claims, 11 Drawing Sheets

(56) References Cited

OTHER PUBLICATIONS

Yu, J-C et al. "The Fabrication and Characterization of Metal-Oxide-Semiconductor Field Effect Transistors and Gated Diodes Using $Ta_2O_5$ Gate Oxide", IEEE International Semiconducting and Insulating Materials Conference, vol. conf. 11, pp. 353-356 (Jul. 2000).

Kim, S. H. et al. "Impact of Body Doping and Thickness on the Performance of Germanium-Source TFETs", IEEE Transactions on Electron Devices, vol. 57, No. 7, pp. 1710-1713 (Jul. 2010).

Extended Search Report for Patent Appln. No. 10187157.2 (Mar. 3, 2011).

* cited by examiner

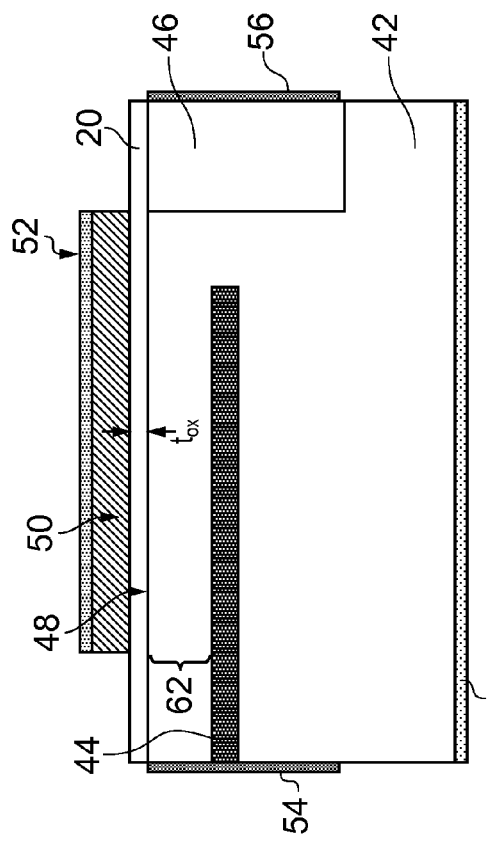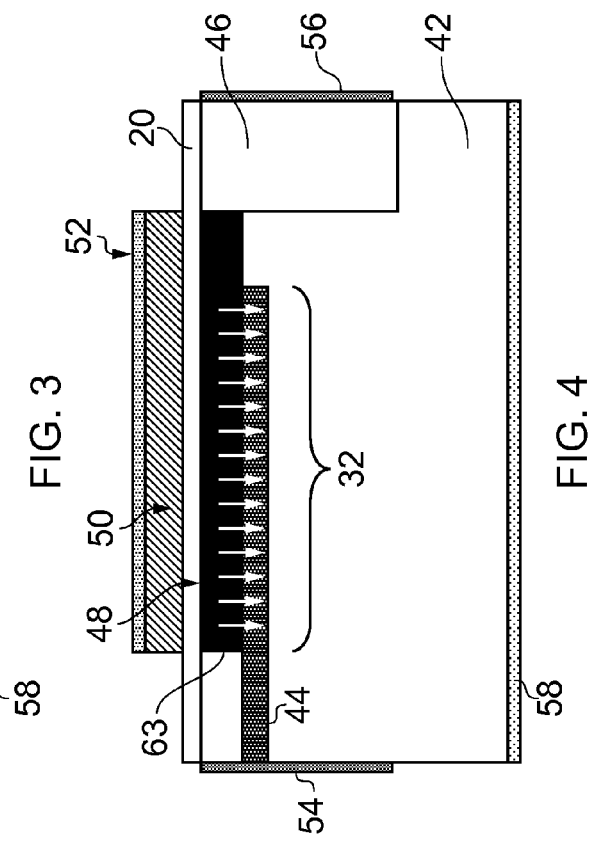

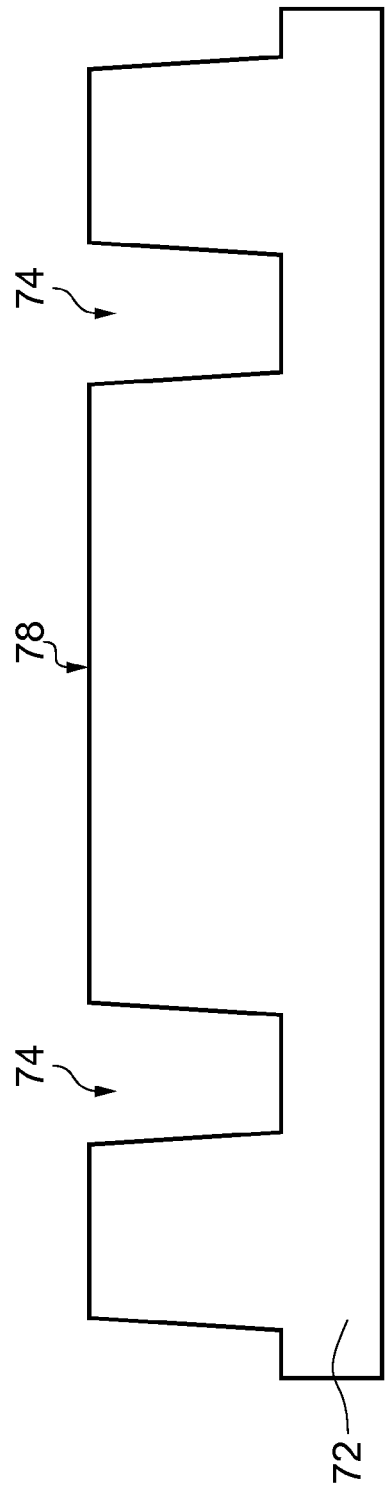
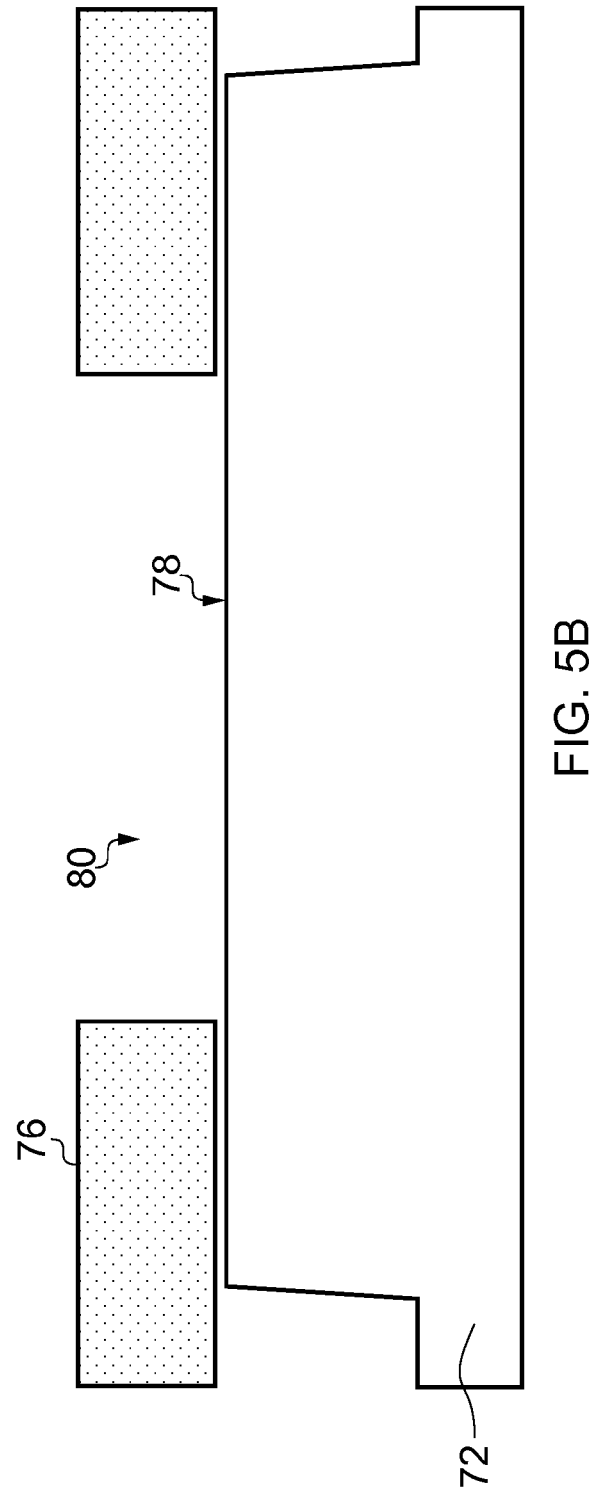

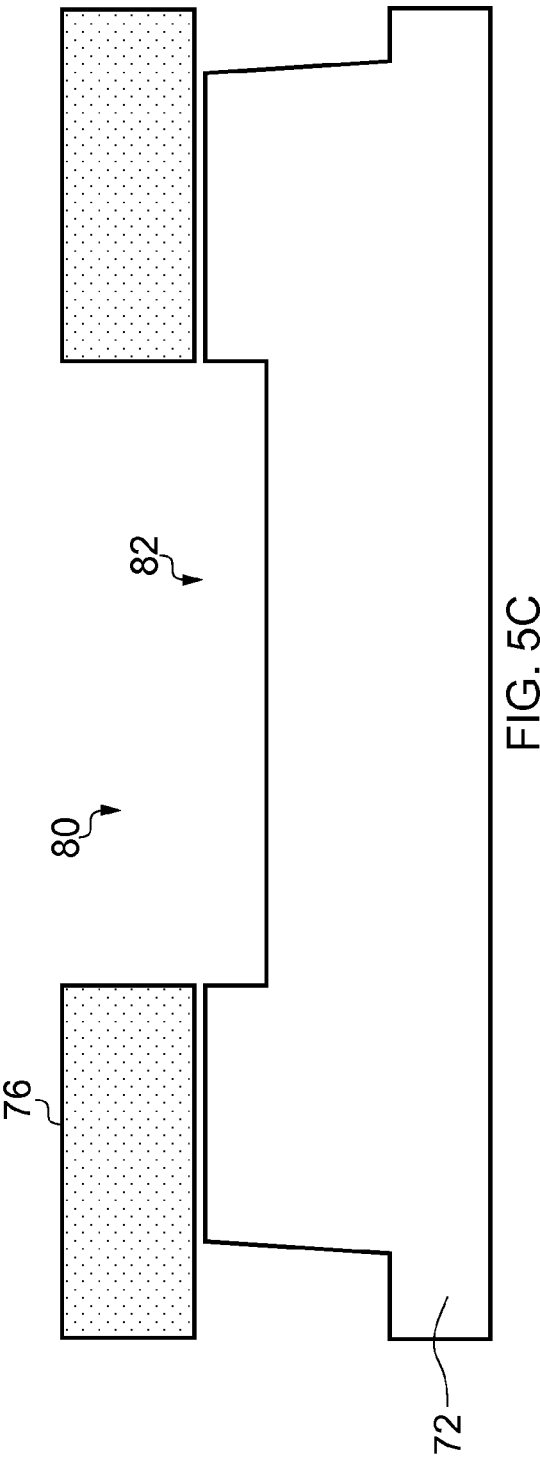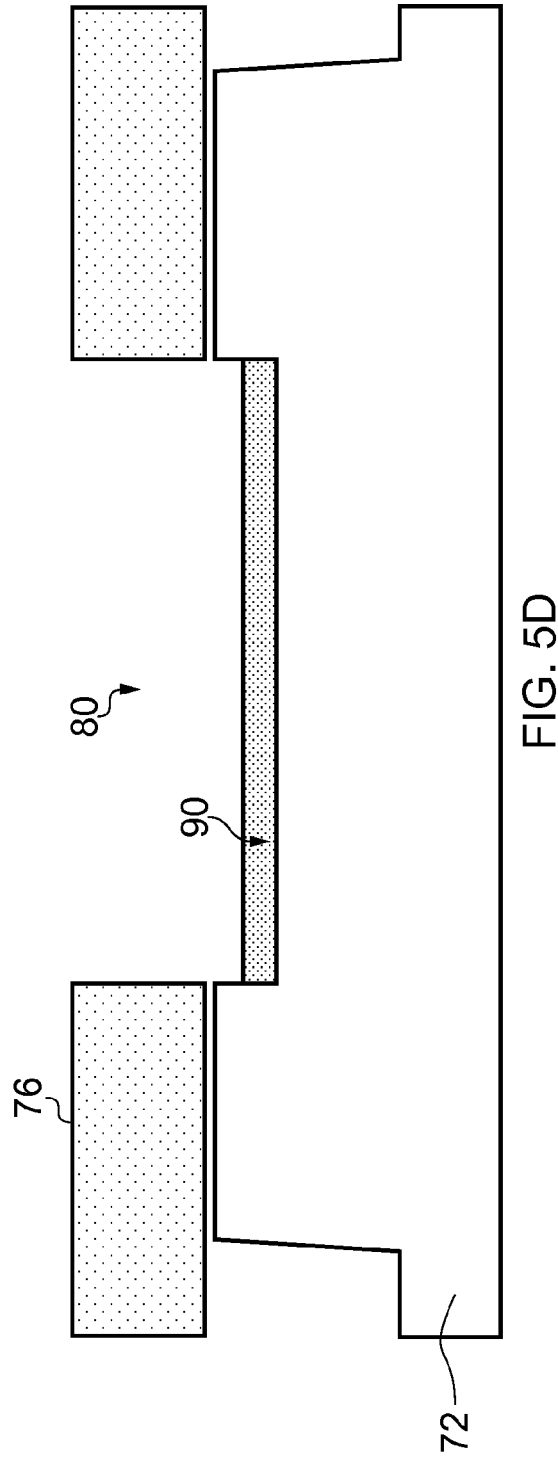

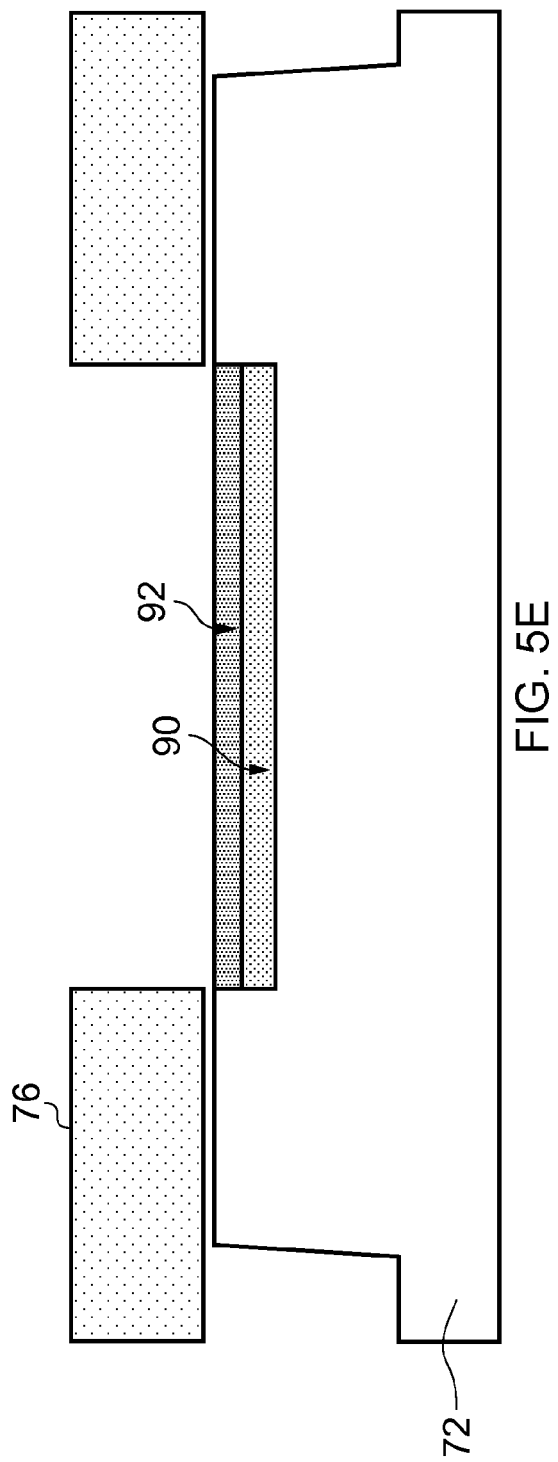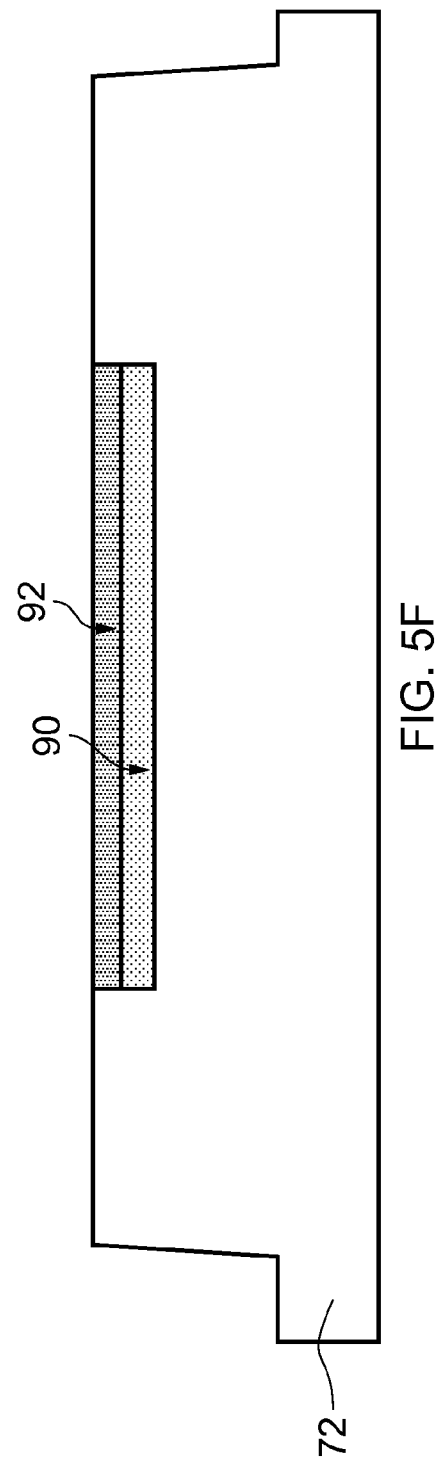

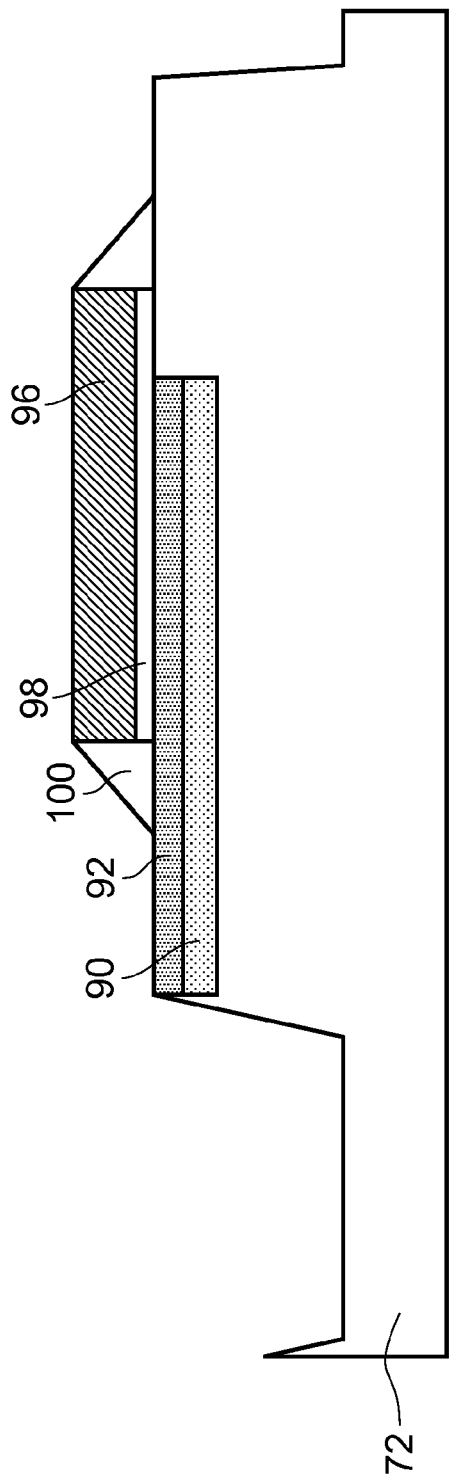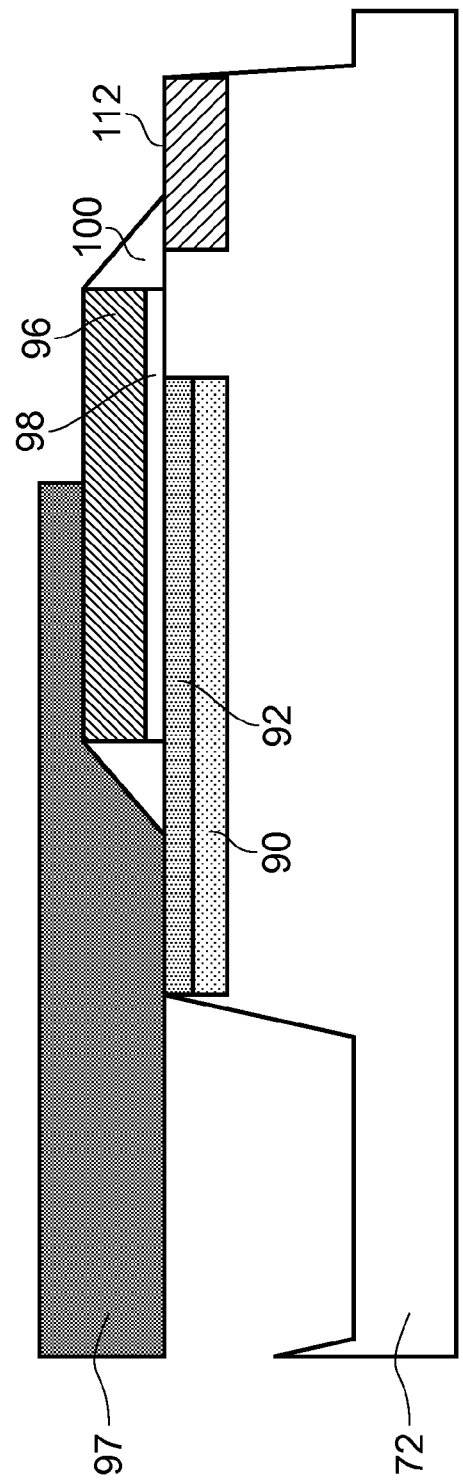

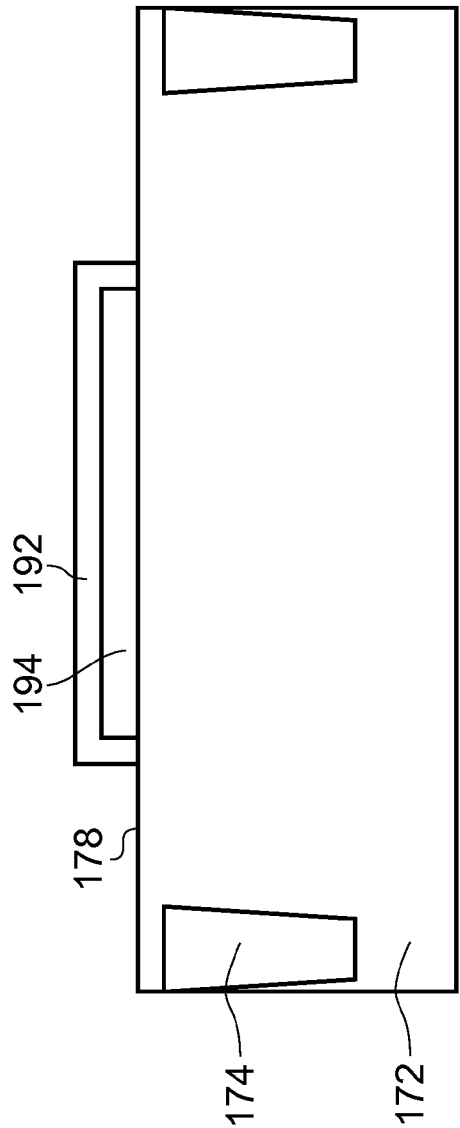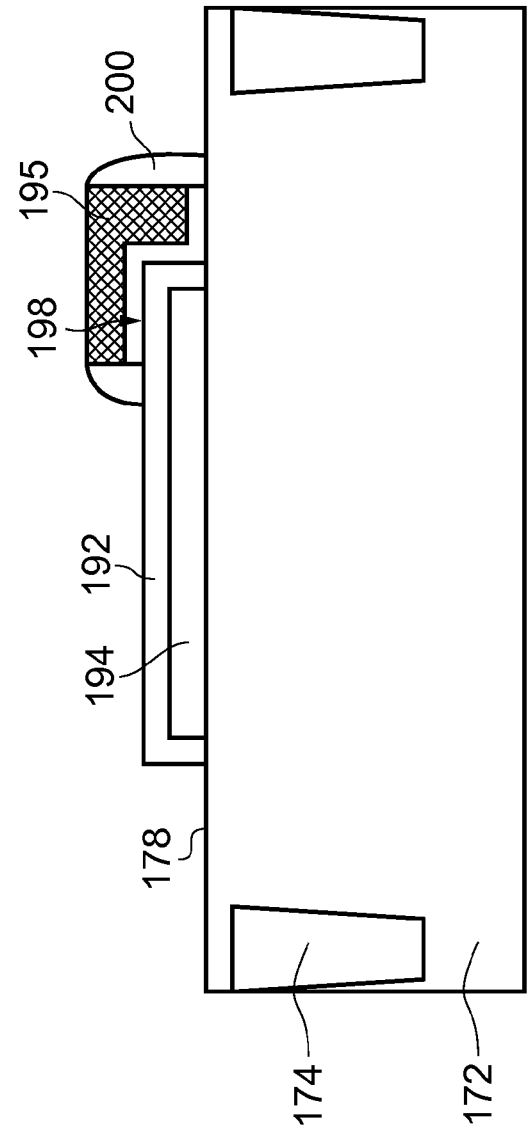

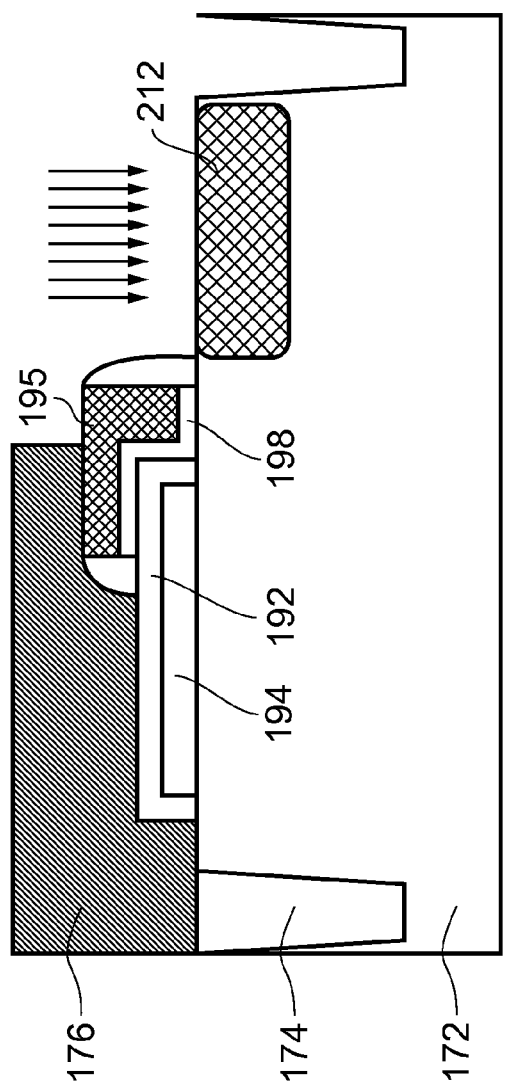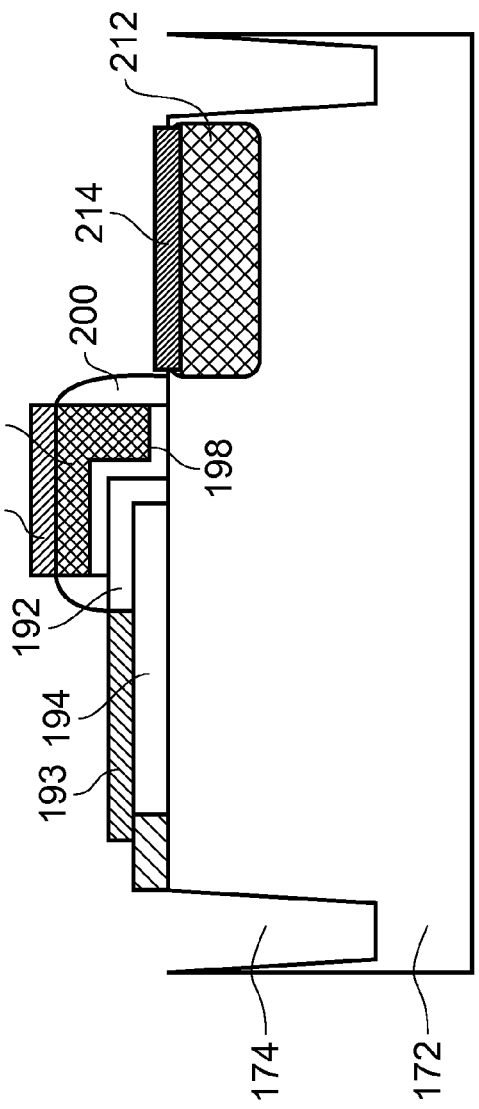

TUNNEL FIELD EFFECT TRANSISTOR

This application claims the priority under 35 U.S.C. §119 of European patent application no. 10187157.2, filed on Oct. 11, 2010, the contents of which are incorporated by reference herein.

BACKGROUND OF THE INVENTION

This invention relates to a tunnel field effect transistor (TFET).

TFETs are a known alternative to bulk MOSFETs, and can offer a number of advantages. For example, they can be highly scalable, do not suffer from short channel effects, can have low off-state currents, can have extremely steep off- to on-state transitions, and can be immune from the effects of random lithographic variations on feature dimensions.

A known kind of TFET is illustrated in FIG. 1. The TFET is incorporated into a semiconductor substrate 2 and includes a source 4, a drain 6 and a gate 10. The source, drain and gate are each provided with contacts 14, 16 and 12. A body contact 18 can also be provided on a rear surface of the substrate 2. A layer of gate oxide 20 is provided on a major surface 8 of the substrate, to electrically isolate the gate 10 from the substrate. The region of the substrate immediately beneath the gate forms a channel region of the device. The source 4 and drain 6 are of opposite conductivity types. In particular, for a p-type substrate, the source 4 can be $p^+$ doped, while the drain 6 can be $n^+$ doped. Typically, the source comprises a material having a smaller band gap than Si, such as Ge or SiGe, which allows the device to deliver reasonable on-state current. The TFET shown in FIG. 1 is an n-type TFET, however p-type TFETs are also known.

The tunnelling operation of the TFET of FIG. 1 is schematically illustrated in FIG. 2. As shown, the tunnelling mechanism occurs at the interface between the gate oxide 20 and the channel, where an inversion layer 3 induced in the channel region by the gate potential touches the source 4. Accordingly, it will be understood that the tunnelling mechanism occurs in a single, point-like region of the device. The limited area at which tunnelling can occur limits the on-state current of the device. Moreover, it will be understood that the performance of the device is heavily reliant upon the characteristics of this point. In particular, imperfections in the device which coincide with this point-like region can lead to degradation in device performance, leading to reliability issues.

As shown in FIGS. 1 and 2, gate oxide 20 covers the channel region, the source 4 and the drain 6. A problem with this design is that while high quality oxide can be formed from the surface of the part of the substrate forming the channel region (which typically may comprise Si), it is difficult to produce high quality oxide from the SiGe or Ge of the source.

Moreover, it is difficult to produce the thick portion (e.g. 300-400 nm) of SiGe or Ge required for the source 4 of the device of FIGS. 1 and 2, even using advanced epitaxial techniques. Preferably, the transition between the source and the substrate should be sharp and well defined. However, the difficulty in producing the thick source region can preclude such a sharp transition.

The above mentioned difficulties, relating to the oxide layer on the substrate surface and to the provision of a thick SiGe or Ge source 4, both increase the likelihood that defects and imperfections will coincide with the single, point-like tunnel region of the device, leading to performance degradation and a large variation on device characteristics.

It is thought that these problems are behind the poor performance of TFET devices compared to theoretical predictions.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a tunnel field effect transistor (TFET) comprising:
  a semiconductor substrate;
  a gate located on a major surface of the substrate;
  a drain of a first conductivity type; and
  a source of a second conductivity type extending beneath the gate and separated from the gate by a channel region and a gate dielectric,
  wherein the transistor is operable to allow charge carrier tunnelling from an inversion layer through an upper surface of the source.

According to another aspect of the invention there is provided a method of making a tunnel field effect transistor (TFET), the method comprising:
  providing a semiconductor substrate;
  forming a source of the transistor, the source having a second conductivity type;
  forming a gate of the transistor on a major surface of the substrate;
  forming a drain of the transistor, the drain having a first conductivity type; and
  wherein the source extends beneath the gate and is separated from the gate by a channel region and a gate dielectric,
  wherein the transistor is operable to allow charge carrier tunnelling from an inversion layer through an upper surface of the source.

Since the source extends beneath the gate, tunnelling can take place through an upper surface of the source, whereby the tunnelling is not limited to a single point-like region as in previous TFET designs. Instead, tunnelling can occur over a range of locations, generally corresponding the surface of the source laying beneath the gate. Accordingly, a TFET according to an embodiment of the invention is not reliant upon the integrity of a single small region of the device for its operation, and is therefore not as prone to large variations in performance caused by the presence of defects or an imperfect doping profile near to the tunnel junction. Moreover, the fact the tunnelling can occur over a range of locations leads to an increased on state current for the device. For example, while the off-state current of a device in accordance with an embodiment of the invention may be of the order of femto Amperes, the on-state current may be similar to that of a FEMT transistor.

In one embodiment, the channel region can be sufficiently thin to allow it to be completely inverted by an applied gate potential. For example, the channel region can have a thickness $t_{ch} \leq 12$ nm.

The source can be provided as a layer of semiconductor material extending beneath the gate. Provision of the source as a layer in this way allows the parameters of the source (e.g. thickness, composition, sharpness of transition with the channel) to be precisely controlled. The source layer can be made relatively thin, for example the thickness $t_s$ of the source layer can be in the range 5 nm $\leq t_s \leq$ 15 nm. The source layer can comprise a layer of epitaxial semiconductor material. In contrast to the device design shown in FIGS. 1 and 2, it is relatively easy to produce a source comprising a relatively thin layer of semiconductor material without encountering stress related problems.

In one example, the source can be buried beneath the surface of the substrate. The gate can then be provided on the surface of the substrate, above the source. In one example, a method of making device includes forming a trench in the major surface of the substrate and then depositing the source as layer in the trench. The channel region can then be deposited as a layer in the trench, over the upper surface of the source. The gate dielectric and gate can then be formed overlapping the channel region using deposition and patterning steps.

In an alternative example, the source can be provided on the major surface of the substrate, and the gate can be provided over the source. A method of making this arrangement can include forming the source as a layer of semiconductor material on the major surface of the substrate and then forming the channel region as a layer over the upper surface of the source. Thereafter, deposition and patterning steps can be used to provide the gate dielectric and gate, wherein the gate dielectric and gate at least partially overlap the source. A part of the gate dielectric and gate not overlapping the source can be located on the major surface of the substrate.

The source can comprise, for example, Ge or SiGe.

The amount of overlap between the gate and the source (hereinafter the gate length) can be chosen according to design requirements (e.g. according to the desired on-state current capability of the device). For example, the overlap may be at least half of the gate length.

BRIEF DESCRIPTION OF THE DRAWINGS

Embodiments of the present invention will be described hereinafter, by way of example only, with reference to the accompanying drawings in which like reference signs relate to like elements and in which:

FIG. 3 shows an example of a TFET according to an embodiment of the invention;

FIG. 4 illustrates the tunnelling process of the TFET of FIG. 3;

FIGS. 5A-5I schematically illustrate a method of making a TFET according to an embodiment of the invention; and FIGS. 6A-6F schematically illustrate a method of making a TFET according to another embodiment of the invention.

DETAILED DESCRIPTION

Figure 1:
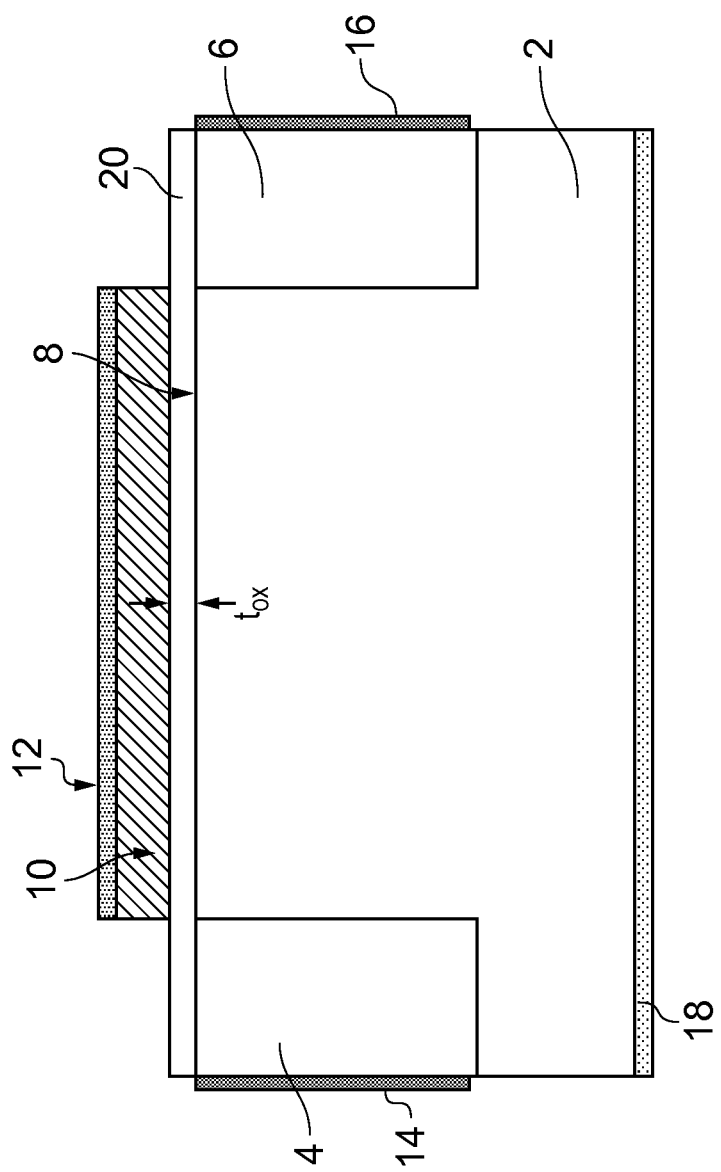
FIGS. 1 and 2 show an example of a known TFET.

Embodiments of the present invention are described in the following with reference to the accompanying drawings.

According to embodiments of this invention, there is provided a tunnel field effect transistor (TFET), that has a source which extends beneath the gate and which is separated from the gate by a channel region and a gate dielectric. This arrangement allows charge carrier tunnelling to take place from an inversion layer induced in a channel region of the device by a potential applied to the gate, through an upper surface of the source. Because the upper surface of the source is generally larger in terms of area than the point-like tunnelling location of earlier TFET designs, the on-state currents obtainable using a device according to embodiments of this invention are generally higher than those obtainable using known TFET designs. Moreover, because the source is generally provided beneath the gate oxide and is separated also from the gate by the channel region, problems relating to the formation of gate oxide at the surface of a semiconductor substrate are avoided.

A first embodiment of a TFET in accordance with this invention is shown in FIG. 3. The TFET shown in FIG. 3 includes a semiconductor substrate 42, which may typically comprise silicon. The TFET includes a source 44 and a drain 46. The source 44 is provided with a source contact 54, while the drain 46 is provided with a drain contact 56. A body contact 58 may also be provided on a underside of the substrate 42. On a major surface 48 of the substrate 42, there is provided a gate oxide 20. A gate 50 having a gate electrode 52 is positioned over the gate dielectric 20. The portion of the semiconductor substrate 42 located generally beneath the gate 50 may be referred to as the channel region 62.

As shown in FIG. 3, the source 44 of the TFET in this example comprises a buried layer of semiconductor material. In particular, the source 44 comprises a semiconductor layer which is buried beneath the major surface 48 of the substrate 42. The source 44 also extends beneath the gate 50 such that the channel region, or at least a portion of the channel region, separates the source 44 from the gate oxide 20. The source 44 is therefore separated from the gate 50 by a combination of a portion of the channel region 62 and a portion of the gate oxide 20. The semiconductor layer forming the source 44 can comprise, for example, SiGe or Ge. As mentioned herein, the formation of a layer of materials of this kind is difficult in situations where the thickness of the layer is above a certain threshold. In particular, thick layers of SiGe and/or Ge are difficult to grow, because defect formation and stress-related problems affect the quality of the layer and the boundaries of the layer with the remainder of the substrate. In accordance with an embodiment of this invention however, the layer forming the source 44 can be grown to a relatively thin dimension, whereby the above mentioned problems do not arise. For example, the thickness of the semiconductor layer forming the source can range from 5-15 nanometers. The layer of semiconductor material forming the source 44 can be, for example, grown epitaxially.

The channel region 62 constitutes a region in the substrate where carrier inversion can be induced by the application of a gate potential, as is well known in the art. The distance at which the source 44 is buried beneath the major surface 48 of the substrate 42 can be chosen in accordance with the desired vertical dimension of the channel region 62. For example, the depth at which the source 44 is buried can be chosen such that substantially the entire portion of the substrate 42 which lies between the gate 50 and the source 44 can be inverted by the application of a gate potential. In one example, the thickness of the channel region can be less than or equal to 12 nanometers.

Figure 5I:
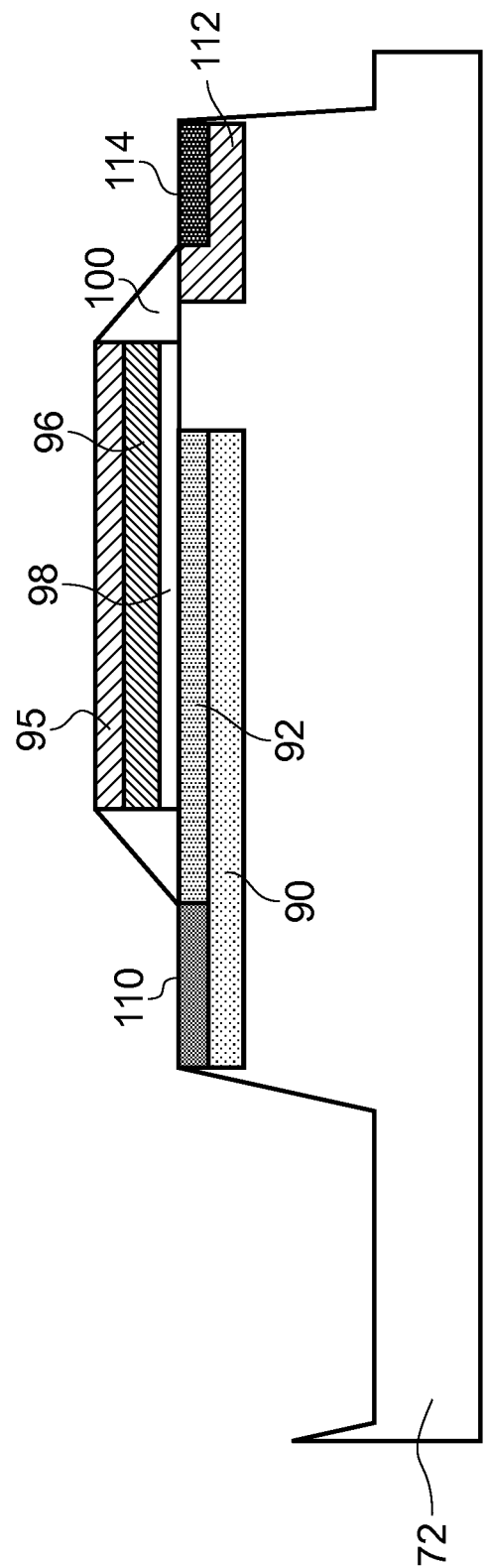

Examples of the manufacturing processes which can be used to fabricate devices of the kind described herein are elaborated in more detail below with reference to FIGS. 5 and 6.

Figure 2:
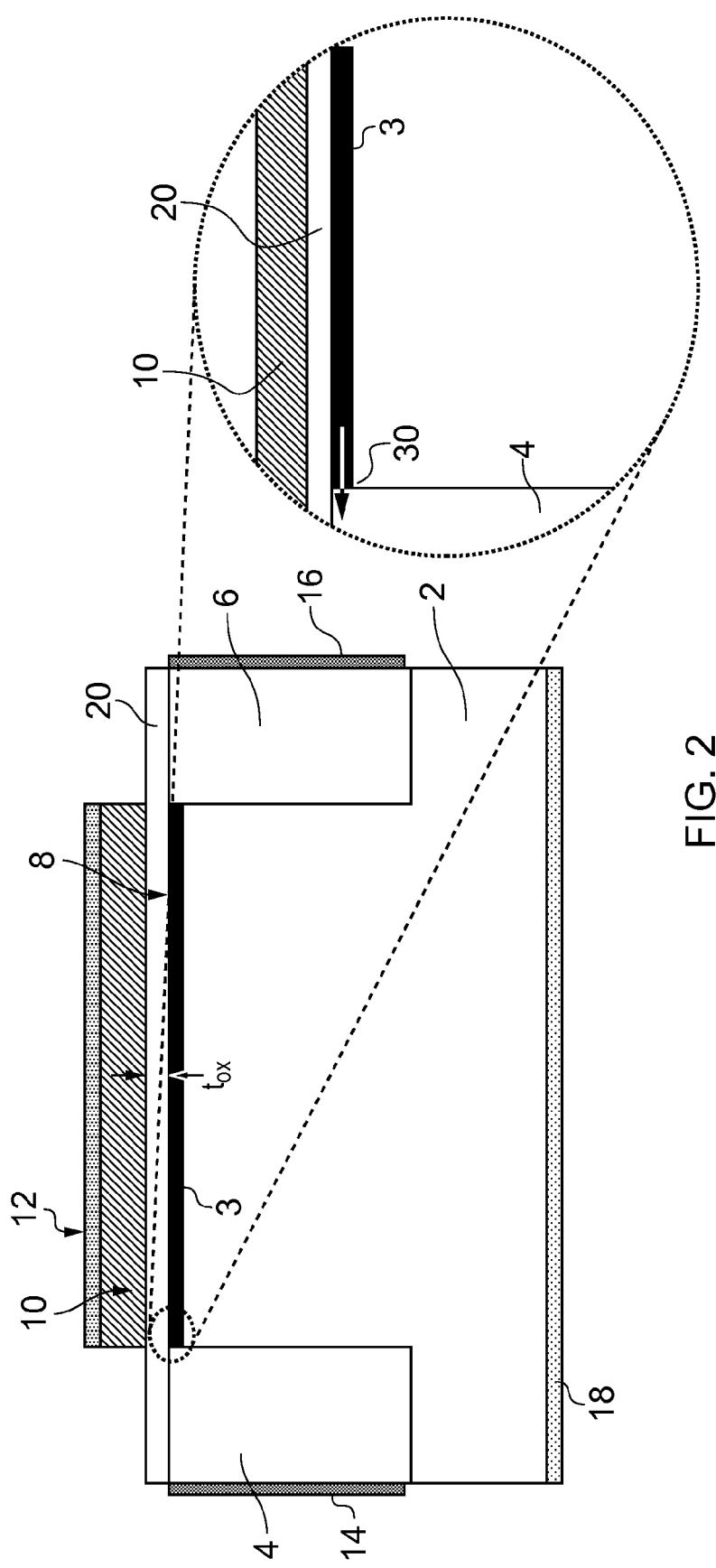

The operation of the TFET shown in FIG. 3 will now be described with reference to FIG. 4. As shown in FIG. 4, an inversion region 63 is formed in the channel region 62 by the application of a gate potential to the gate 50. In contrast with know TFET designs (for example, designs such as those described above in relation to FIGS. 1 and 2), and as illustrated in FIG. 4, tunnelling from the inversion region 63 can take place through a upper surface of the source 44 in a wide range of locations, which are generally indicated in FIG. 4 by the arrows labelled 32. It will be appreciated that because a large area is available for tunnelling (generally, this area will comprise a portion of the upper surface of the source 44 which lies beneath the gate 50), a relatively large tunnelling current may flow within the device. Moreover, because the layer forming the source 44 may generally be a thin layer of a material such as SiGe or Ge, the quality of the interface between the layer forming the source 44 and the portion of the substrate 42 forming the channel region 62 may generally be of high quality (low stress, and relatively defect free). Thus, the tunnelling current in the device should not generally suffer from the limitations imposed by poor crystalline quality or localised defects. Moreover, even if defects of this kind were to be present in localised portions of the upper surface of the source 44, in general, the overall tunnelling current of the device may not be heavily affected by the presence of such localised imperfections, since the remainder of the upper surface of the layer forming source 44 would still be available for current flow. Because of this, variations in on-state current flow between devices of the kind described herein are generally mitigated against, since the quality of the device is not heavily affected by the integrity of any particular portion of the interface between the layer forming the source 44 and the channel region 62.

The example TFET described above in relation to FIGS. 3 and 4 includes a source 44 which comprises a layer of semiconductor material which is buried beneath a major surface 48 in a substrate 42. An example of the manufacture process which can be used to construct such a device will now be described in relation to FIGS. 5A to 5I. Subsequently, a further example of a TFET and its manufacture will be described in relation to FIGS. 6A to 6F. In the example described in FIGS. 6A to 6F, the source is not buried beneath the surface of the substrate, but is instead provided above the surface in a layer upon which the channel regions and gates are subsequently also formed.

A first stage of the manufacture of a TFET in accordance with an embodiment of this invention is shown in FIG. 5A. In this first stage, there is provided a substrate 72 which, for example, may comprise silicon. In this example, a device region is first defined by the provision of isolation trenches 74 filled with a dielectric material. The trenches 74, which may comprise, for example, shallow trench isolation (STI), are etched into a major surface 78 of the substrate 72 and are subsequently filled with a dielectric material. A process such as chemical mechanical polishing (CMP) can be used to level off excess dielectric located on the major surface 78 following deposition of the dielectric into the trenches 74.

In a next stage, a hard mask 76 is provided on the major surface 78 (as shown in the Figures, in some examples a thin layer of the dielectric which has been deposited onto the substrate to fill the trenches 74 may at this stage remain on the major surface 78). An opening 80 is etched into the hard mask.

In a next stage shown in FIG. 5C, an etching process is used to etch a trench 82 into the substrate 72 through the opening 80.

In a next stage, as shown in FIG. 5D, a layer 90, which subsequently forms the source of the device, is deposited into the trench 82. The layer 90 which may, for example, be deposited using an epitaxial process, may typically comprise a material such a SiGe or Ge. The layer can, for example, be deposited epitaxially. In some examples, prior to the deposition of the layer 90, a Si buffer layer may deposited (e.g. epitaxially) at the bottom of the trench 82.

Thereafter, as shown in FIG. 5E, a further layer 92 of semiconductor material may be deposited into the trench 82. The further layer 92 forms the channel region of the device, and therefore may be comprised of any suitable material for forming said channel region, for example, silicon.

Following the deposition steps described in FIGS. 5D and 5E, the hard mask 76 is removed to leave the structure showing in FIG. 5F.

Thereafter, as shown in FIG. 5G, standard techniques may be used to form a gate stack above the deposited layers, such that at least a portion of the source 90 and the channel 92 extend beneath the gate stack. The gate stack can include a gate material 96 situated above a gate dielectric 98, the gate dielectric being provided on the surface of the substrate 72 and the surface of the layer forming the channel 92. Spacers 100 may also be provided on either side of the gate stack, as is well known in the art.

In a next stage shown in FIG. 5H, following formation of the gate stack, a next hard mask 97 is deposited and patterned, and thereafter a process such as ion implantation can be used to dope a portion of the substrate 72 adjacent the gate stack to form a drain 112 of the device.

Thereafter, the hard mask 97 can be removed and contacts 110, 95 and 114 can be formed for the source 90, the gate material 96 and the drain 112.

Accordingly, there has been described a method of forming a TFET of the kind described above in relation to FIGS. 3 and 4. In this particular design of TFET, the source comprises a layer of semiconductor material 2 which is separated from the gate material 96 by a channel region 94 and a gate dielectric 98. The layer forming the source 92 is buried beneath the surface of the substrate 72 using the etching and deposition steps described above.

Another example of a TFET, and a manufacturing process for fabricating the TFET will now be described in relation to FIGS. 6A to 6F.

Figure 6A:
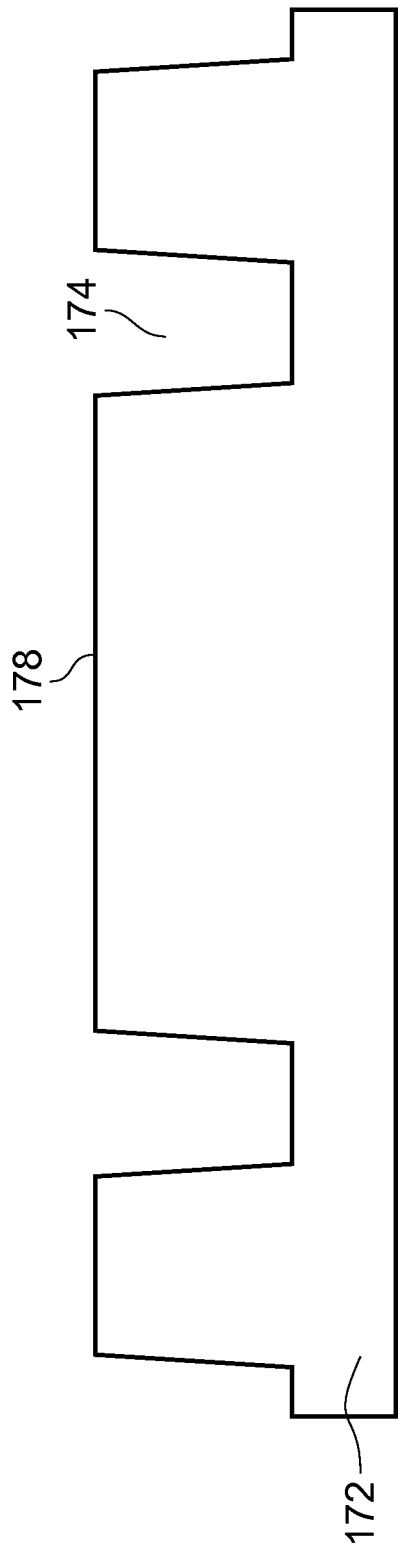

A first step in the manufacture of this second example of a TFET is shown in FIG. 6A. In particular, a substrate 172 is provided, the substrate 172 having a major surface 178 in which isolation trenches 174 such as STI trenches are provided.

Figure 6B:
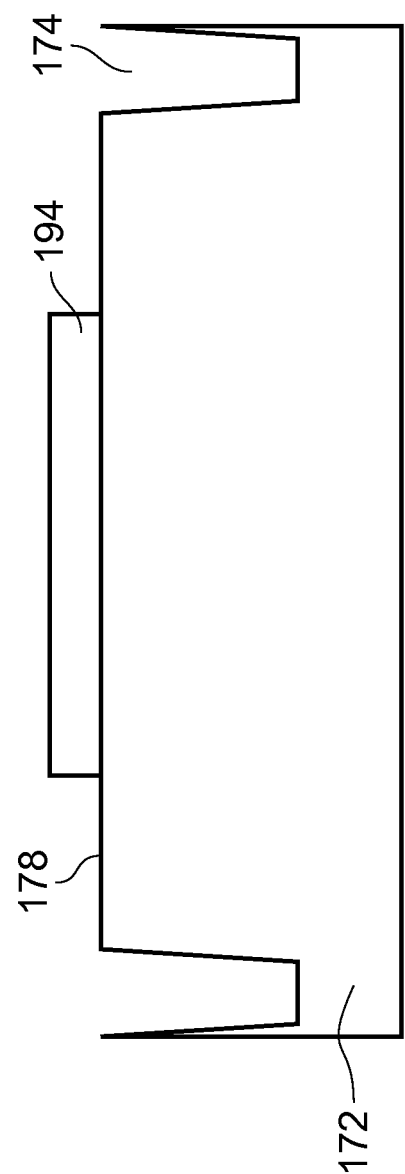

In a next stage shown in FIG. 6B, a layer of semiconductor material is deposited onto the major surface 178 of the substrate 172. The layer may be grown using, for example, an epitaxial process. The layer is than patterned to form the configuration shown in FIG. 6B. The layer will subsequently form the source 194 of the TFET, and may, for example, comprise a material such as SiGe or Ge.

Next, and as shown in FIG. 6C, deposition and patterning steps are used to deposit a layer which substantially covers the layer forming the source 194. This further layer will subsequently form a channel 192 of the TFET. The layer forming channel 192 may, for example, comprise silicon.

After the formation of the source and channel region layers described above, as shown in FIG. 6D, a next stage to use standard deposition and patterning steps to form gate stack over an edge of the source and channel layers. The gate stack includes a gate dielectric 198 and a gate material 195, and may also include spacers 200.

After formation of the gate stack, a hard mask 176 can be deposited over the source and channel region layers and a process such as ion implantation can be used to form the drain 212 of the device, as shown in FIG. 6E. Subsequently, as shown in FIG. 6F, the hard mask 176 can be removed and contacts 193 197 and 214 can be made to the source 194 the gate material 195 and the drain 212 respectively. The contacts described herein to the source gate and drain can, for example, be formed using a silicidation process.

In common with the first example described above in relation to FIGS. 3-5, the finished device shown in FIG. 6F includes a source 194 which extends beneath the gate stack and which is separated from the gate material 195 by a channel region 192 and a gate dielectric 198. The operation of the device shown in FIG. 6F is accordingly similar to the operation of the device of FIGS. 3 to 5. In particular, because the source 194 extends beneath the gate, an upper surface of the source 194 provides a large area for tunnelling to take place.

It will be appreciated, however, that the device in FIG. 6F differs from the first embodiment, in so far as the source 194 itself is not buried beneath a major surface of the substrate 172, but is instead above the surface of the substrate 172. As can be seen in FIG. 6F, a portion of the gate dielectric which does not overlap the source 194 serves to isolate the gate material 195 from the substrate—this portion can be seen in FIG. 6F directly between the substrate surface and the gate material 195. Moreover, a portion of the channel 192 is provided in this example to extend vertically down a side wall of the source 194 a corresponding portion of the gate dielectric 198 also extends down the side wall of the source 194. In this manner, the side wall of the source 194 can also provide an area for tunnelling to take place, further enhancing the on-state of the device.

Accordingly, there has been described a tunnel field effect transistor (TFET) and a method of making the same. The transistor includes a semiconductor substrate. The transistor also includes a gate located on a major surface of the substrate. The transistor further includes a drain of a first conductivity type. The transistor also includes a source of a second conductivity type extending beneath the gate. The source is separated from the gate by a channel region and a gate dielectric. The transistor is operable to allow charge carrier tunnelling from an inversion layer through an upper surface of the source.

Although particular embodiments of the invention have been described, it will be appreciated that many modifications/additions and/or substitutions may be made within the scope of the claimed invention.

The invention claimed is:

1. A tunnel field effect transistor comprising:
a semiconductor substrate;
a gate located on a major surface of the substrate;
a drain of a first conductivity type; and
a source of a second conductivity type below and completely separated from the major surface of the substrate, wherein the source comprises Ge or SiGe, at least a portion of the source extending directly beneath the gate and separated from the gate by a channel region and a gate dielectric, the channel region being a region where channel inversion can be induced by the application of a potential to the gate,
wherein the transistor is configured and arranged to allow charge carrier tunnelling from an inversion layer through an upper surface of the source.

2. The transistor of claim 1, wherein the channel region has a thickness $t_{ch} \leq 12$ nm, and the source is separated from the major surface of the substrate by the thickness of the channel region.

3. The transistor of claim 1, wherein the source comprises a portion of a layer of semiconductor material extending beneath the gate.

4. The transistor of claim 3, wherein the layer of semiconductor material has a thickness $t_s$ in the range 5 nm $\leq t_s \leq$ 15 nm.

5. The transistor of claim 3, wherein the layer of semiconductor material is a layer of epitaxial semiconductor material.

6. The transistor of claim 3, wherein the layer of semiconductor material is buried beneath the major surface of the substrate.

7. The transistor of claim 1, wherein the gate, gate dielectric, source and channel region are configured and arranged to tunnel carriers by creating an inversion layer in a portion of the channel region between the gate and the source, the portion of the channel region being in direct contact with the upper surface of the source, and by flowing carriers between the inversion layer and the upper surface of the source.

8. The transistor of claim 7, wherein a portion of the source extends laterally below at least half of a lateral extent of the gate, the portion being in direct contact with the channel region and being separated from the gate by the channel region.

9. The transistor of claim 1, wherein the gate and the source overlap laterally along the major surface of the substrate, and the overlap is approximately half the gate length.

10. The transistor of claim 1, wherein the gate and the source overlap laterally along the major surface of the substrate, and the overlap is approximately half the gate length, and the source is separated from the gate by a combination of a portion of the channel region and a portion of the gate dielectric.

11. The transistor of claim 1, further including:
a trench in the major surface of the substrate;
a layer in the trench; and
the channel region being a layer in the trench, over the upper surface of the source.

12. The transistor of claim 11, further including the source being below and separated from the major surface of the substrate by a thickness of the channel region.

13. A method of making a tunnel field effect transistor, the method comprising:
providing a semiconductor substrate having a major surface;
forming a source of the transistor below and completely separated from the major surface of the substrate, the source having a second conductivity type;
forming a gate of the transistor on the major surface of the substrate; and
forming a drain of the transistor, the drain having a first conductivity type;
wherein at least a portion of the source extends directly beneath the gate and is separated from the gate by a channel region and a gate dielectric, and
wherein the transistor is configured and arranged to allow charge carrier tunnelling from an inversion layer through an upper surface of the source.

14. The method of claim 13 comprising:
forming a trench in the major surface of the substrate;
depositing the source as a layer in the trench; and
depositing the channel region as a layer in the trench, over the upper surface of the source.

15. The method of claim 14, further comprising depositing and patterning the gate dielectric and gate over the channel region, and wherein the step of forming the source includes forming the source below and separated from the major surface of the substrate by a thickness of the channel region.

16. The method of claim 13 comprising:
forming the channel region as a layer over the upper surface of the source.

17. The method of claim 16 further comprising:
depositing and patterning the gate dielectric and gate, wherein the gate dielectric and gate at least partially overlap the source.

18. The method of claim 17, wherein depositing and patterning the gate dielectric and gate include depositing a part of the gate dielectric and gate not overlapping the source on the major surface of the substrate.

19. The method of claim 13, further including forming the gate dielectric, the channel region being in the substrate, wherein the forming the gate, gate dielectric, source and channel region includes configuring and arranging the gate, gate dielectric, source and channel region to tunnel carriers by creating an inversion layer in a portion of the channel region between the gate and the source, the portion of the channel region being in direct contact with the upper surface of the source, and by flowing carriers between the inversion layer and the upper surface of the source.

20. The method of claim 19, wherein forming the source includes forming a portion of the source extending laterally below at least half of a lateral extent of the gate, the portion being in direct contact with the channel region and being separated from the gate by the channel region.

21. The method of claim 13, wherein the steps of forming the source and forming the gate include forming the gate and the source to overlap laterally along the major surface of the substrate, and the overlap is approximately half the gate length.

\* \* \* \* \*